United States Patent [19]
Nakajima

[11] Patent Number: 5,382,821
[45] Date of Patent: Jan. 17, 1995

[54] HIGH POWER FIELD EFFECT TRANSISTOR

[75] Inventor: Shigeru Nakajima, Yokohama, Japan

[73] Assignee: Sumitomo Electric Industries, Ltd., Osaka, Japan

[21] Appl. No.: 988,258

[22] Filed: Dec. 14, 1992

[51] Int. Cl.$^6$ ............... H01L 27/085; H01L 27/088; H01L 27/105

[52] U.S. Cl. .................. 257/401; 257/502; 257/333; 257/487

[58] Field of Search ............. 257/487, 488, 401, 502, 257/341, 192, 401, 333, 334, 487, 488, 341, 192, 502

[56] References Cited

U.S. PATENT DOCUMENTS

| | | | |
|---|---|---|---|
| 4,742,380 | 5/1988 | Chang et al. | 257/341 |
| 4,928,155 | 5/1990 | Nakagawa et al. | 257/341 |
| 5,001,536 | 3/1991 | Fukuzawa et al. | 257/192 |
| 5,124,770 | 6/1992 | Umemoto et al. | 257/192 |
| 5,132,753 | 7/1992 | Chang et al. | 257/408 |
| 5,191,401 | 3/1993 | Shirai et al. | 257/401 |

OTHER PUBLICATIONS

Geissberger et al., "New Refractory Self-Aligned Gate Technology for GaAs Power FET's and MMIC's", IEEE Electron Devices, vol. 35, No. 5, May 1988.

Primary Examiner—Rolf Hille
Assistant Examiner—Wael M. Fahmy
Attorney, Agent, or Firm—Beveridge, DeGrandi, Weilacher & Young

[57] ABSTRACT

There is disclosed an FET having a high drain breakdown voltage and a short gate length comprising an active layer 2 formed on a surface layer of a semiconductor substrate 1; a highly doped impurity source region 4 and highly doped impurity drain region 4 formed in the surface layer of the semiconductor substrate 1 to sandwich the active layer 2; an insulation film 5 formed on the highly doped impurity source region 4; a gate electrode 8 formed on the active layer 2 and the insulation film 5 while maintaining a constant distance $l_{GD}$ from the highly doped impurity drain region 4; and a source electrode 6 and a drain electrode 7 formed on the highly doped impurity source region 4 and the highly doped impurity drain region 4, respectively.

6 Claims, 4 Drawing Sheets

Fig. ID
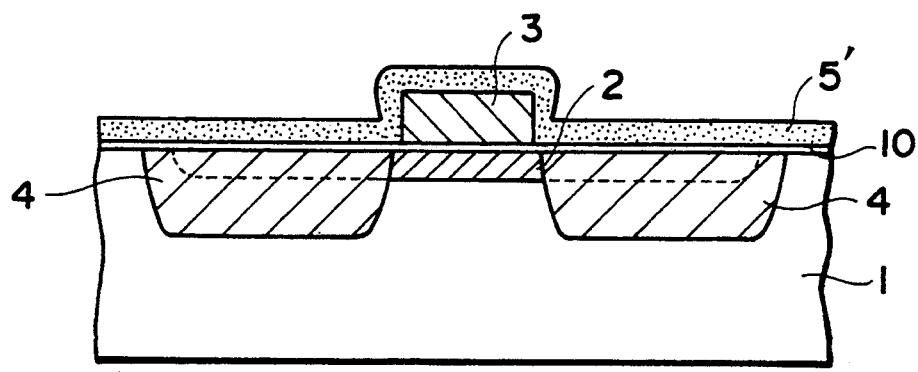
Fig. IE
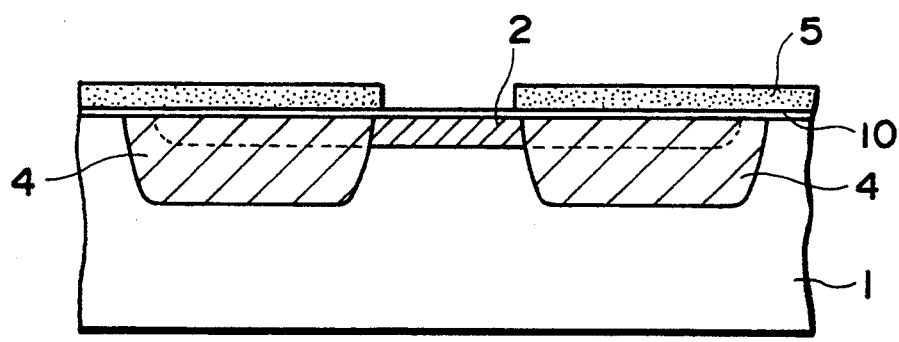
Fig. IF
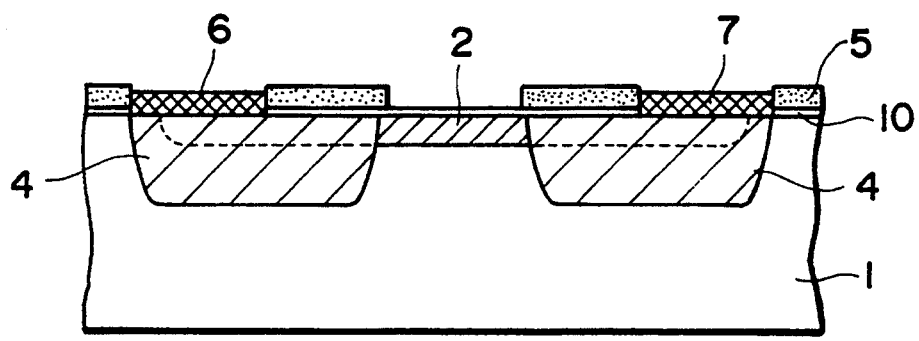

HIGH POWER FIELD EFFECT TRANSISTOR

BACKGROUND OF THE INVENTION

1. Field of the Invention

The present invention relates to a high power field effect transistor (FET) and method for manufacturing the same.

2. Related Background Art

Because a high power FET needs a high drain breakdown voltage, an FET having the following structure has been proposed. An example is a recessed FET. In such an FET, a recess is formed in a gate region by etching. As a gate electrode is formed in the recess, a source-gate distance is extended and a drain breakdown voltage is enhanced. In order to enhance the drain breakdown voltage, it has also been proposed to space a refractory gate electrode from a drain region ("A New Refractory Self-Aligned Gate Technology for GaAs Microwave Power FET's and MMIC's" IEEE TRANSACTIONS ON ELECTRON DEVICES, vol. 35, No. 5, May 1988).

However, in the prior art FET having the recess structure, since the gate region is recessed by etching, it has been difficult to attain a highly reproducible device characteristic because of reproducibility and controllability of etching.

In the FET disclosed in the above reference, the gate region is of non-etched planar structure but the material of the gate electrode must be a refractory material having heat resistance, and a gate resistance is high. Further, it is difficult to attain a gate electrode of sub half micron such as a gate length of 0.5 μm.

SUMMARY OF THE INVENTION

It is an object of the present invention to provide a field effect transistor having a high gate breakdown voltage and a short gate length, and a method for manufacturing the same.

In order to achieve the above object, the FET of the present invention comprises:

an active layer formed in a surface layer of a semiconductor substrate;

a highly doped impurity source region and a highly doped impurity drain region formed in the surface layer of the semiconductor substrate to sandwich the active layer;

an insulation film formed on the source highly doped impurity region;

a gate electrode formed on the active layer and the insulation film while maintaining a constant distance from the highly doped impurity drain region; and a source electrode and a drain electrode formed on the highly doped impurity source region and the highly doped impurity drain region respectively.

The method for manufacturing the FET of the present invention comprises the step of:

forming an active layer in a surface layer of a semiconductor substrate;

forming a dummy gate on the active layer;

forming a highly doped impurity source region and a highly doped impurity drain region in the surface layer of the semiconductor substrate by ion implantation using the dummy gate as a mask;

depositing an insulation film on the surface of the semiconductor substrate and lifting off the insulation film of the dummy gate area by using the dummy gate;

removing the insulation films on the highly doped impurity source region which are spaced from the active layer and forming a source electrode and a drain electrode in the exposed areas; and forming on the active layer a gate electrode having one end thereof spaced from the highly doped impurity drain region and the other end thereof overlapped on the imsulation film on the highly doped impurity source region.

In accordance with the FET of the present invention, since a portion of the gate electrode is formed on an insulation film adjacent to the source electrode in an overlapped and offset fashion, a certain distance is secured between the gate electrode and the drain electrode. As a result, a high drain breakdown voltage is attained. An essential gate length is a portion of the gate electrode which contacts to an active layer, and it is shorter than the length of the gate electrode itself.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIGS. 1A–1G show process sectional views of one embodiment of the method for manufacturing FET of the present invention.

DETAILED DESCRIPTION OF THE PREFERRED EMBODIMENTS

FIGS. 1A–1G show sectional views in a manufacturing process to complete a Schottky barrier type FET (MESFET) in one embodiment of the present invention. The manufacturing process is explained below.

First, an active layer 2 is formed in a surface layer of a semi-insulative GaAs semiconductor substrate 1. Then, a silicon nitride film 10 is deposited on the surface of the semiconductor substrate 1 to a thickness of approximately 1000 Å (see FIG. 1A). The active layer 2 may be formed by an ion implantation method in which $Si^+$ ions having dose of $3\times10^{12}/cm^2$ are accelerated under an electric field of 30 KeV. The silicon nitride film 10 may be formed by a CVD method. The silicon nitride film 10 is used as a protection film for an annealing process, which will be performed later, for the active layer 2.

Figure 1A:
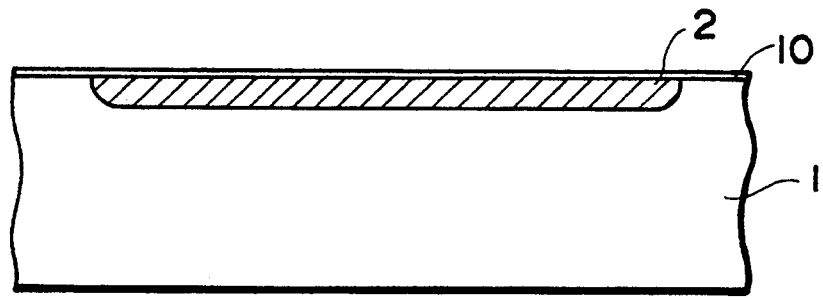
Figure 1B:
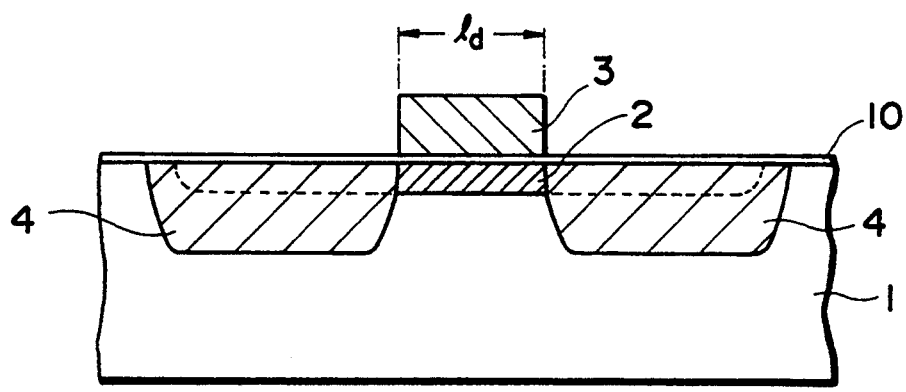
Figure 1C:
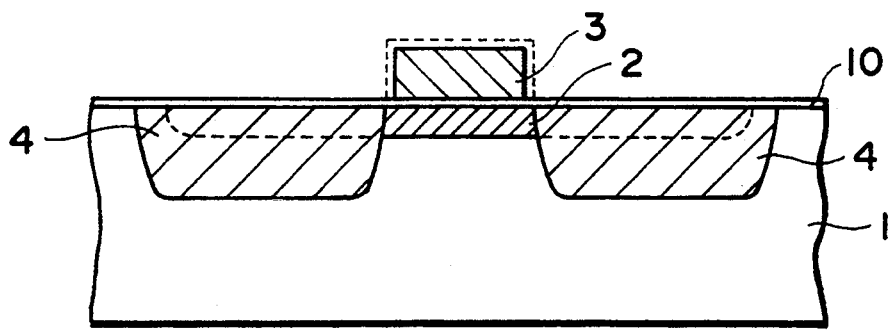

Then, a dummy gate 3 is formed by a opticallithography technique. The material of the dummy gate 3 is a resist material, and a dimension $1_d$ of the dummy gate 3 corresponding to the gate length is, for example, 2 μm. Then, a highly doped n+ layer (n+ region) 4 having a high impurity concentration is formed by an ion implantation method using the dummy gate 3 as a mask (see FIG. 1B). The ion implantation is carried out while Si+ ions having a dose of $4 \times 10^{13}/cm^2$ are accelerated under application of an electric field of 120 KeV. In FIG. 1B, a lefthand n+ region 4 is a highly doped impurity source region, and a righthand n+region 4 is a highly doped impurity drain region.

Then, the gate length of the dummy gate 3 is slightly reduced. It is done by slightly and isotropically grinding the entire surface (top surface and side surface) of the dummy gate 3 by $O_2$ plasma etching (see FIG. 1C).

Then, an insulation film 5' made of $SiO_2$ is formed on the entire surface of the substrate including the reduced dummy gate 3 (see FIG. 1D). The dummy gate 3 is then lifted off to form an insulation film 5 having a inversion pattern to the dummy gate 3 (see FIG. 1E). Then, in order to activate the Si+ ions implanted into the semiconductor substrate 1, it is annealed at 800° C. for 20 minutes. Then, ohmic electrode formation areas in the insulation film 5 and the anneal protection film 10 are selectively removed by using a opticallithographic technique and an RIE method. A source electrode 6 and a drain electrode 2 which are made of AuGe/Ni metal are formed on the n +region 4 exposed by the removal (see FIG. 1F).

Figure 1G:
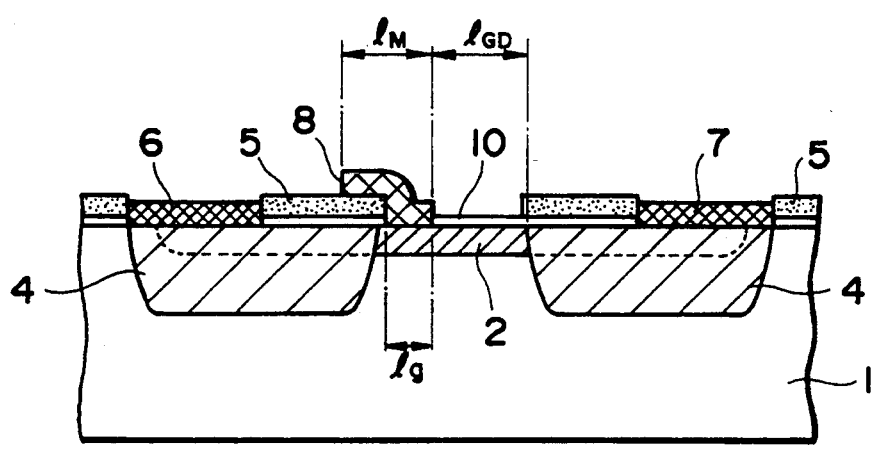

After the formation of the ohmic electrodes, a gate electrode pattern is formed on the substate by the opticallithography technique. The pattern is formed to be offset toward the source electrode 6, that is, the center of the gate is offset toward the source electrode 6. A low resistance metal made of Ti/Pt/Au is vapor-deposited on the gate electrode pattern, and the metal of unnecessary areas is removed by the lift-off method to form a gate electrode 8. As a result, an MESFET having a structure shown in FIG. 1G is completed. A portion of the gate electrode 8 contacts to the active layer 2 and the remaining portion overlaps on the insulation film 5 which is adjacent to the source electrode 6.

Prior to the formation of the gate electrode 8, the anneal protection film 10 in the gate electrode formation area on the active layer 2 is removed. Where the anneal protection film 10 is the silicon nitride film as it is in the present embodiment, it may be removed by the RIE method using $CF_4$. If the active layer 2 is annealed in an atmosphere of $AsH_3$, anneal protection film 10 is not necessary.

In accordance with the present embodiment, since a portion of the gate electrode 8 is formed on the insulation film 5 on the side of the source electrode 6 in the overlapped and offset fashion, a constant distance $1_{GD}$ (1.5 μm in the present embodiment) is secured between the gate electrode 8 and the n+ region 4 on the drain side. As a result, the drain breakdown voltage of the FET may be enhanced. Further, since only the portion of the gate electrode 8 is formed on the active layer 2, the essential gate length $1_g$ is determined by the portion of the gate electrode 8 which contacts to the active layer 2. Namely, assuming that the metal length $1_M$ of the gate electrode 8 is 1.0 μm and the overlap of the source electrode 6 on the insulation film 5 is 0.5 μm, the actual gate length $1_g$ is 0.5 μm.

Figure 2:
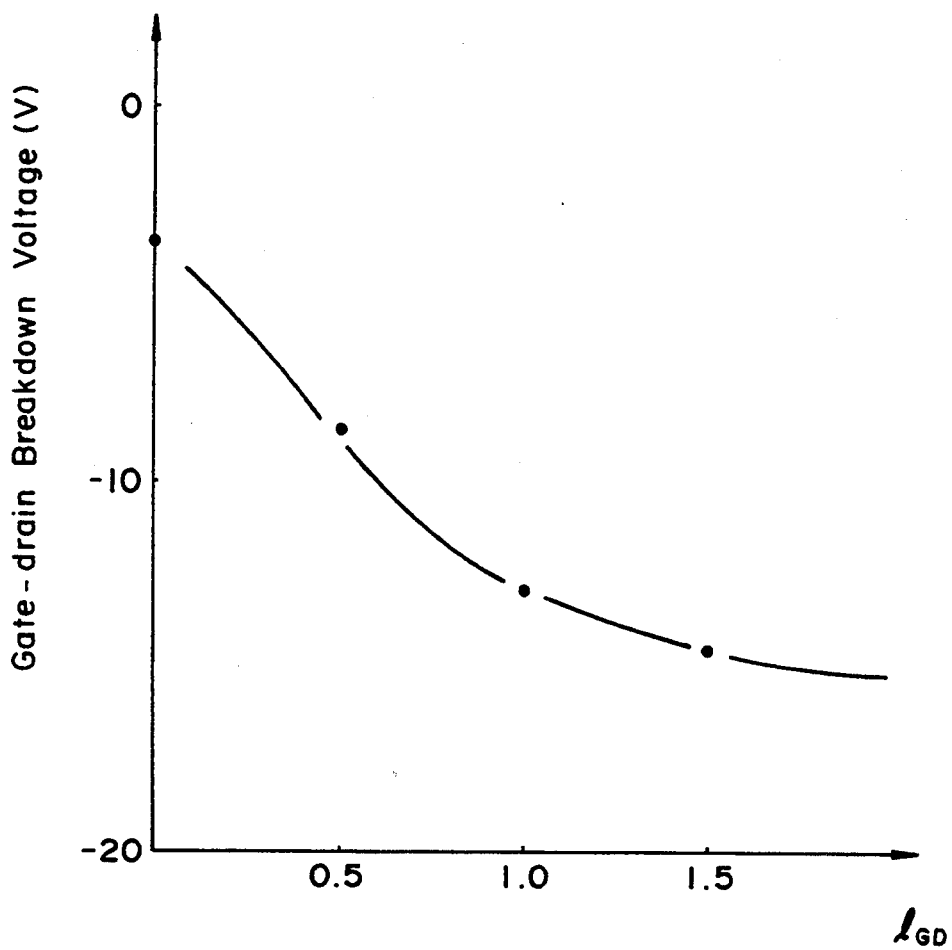
FIG. 2 shows a graph of experimental data on a relation between a distance $1_{GD}$ and a gate-drain breakdown voltage.

FIG. 2 shows a graph of an experimental result on a relationship between the distance $1_{GD}$ and the gate-drain breakdown voltage (drain breakdown voltage). According to the experimental result, when the distance $1_{GD}$ exceeds 1 μm, the gate-drain breakdown voltage starts to saturate and it substantially saturates over 1.5 μm.

Figure 3:
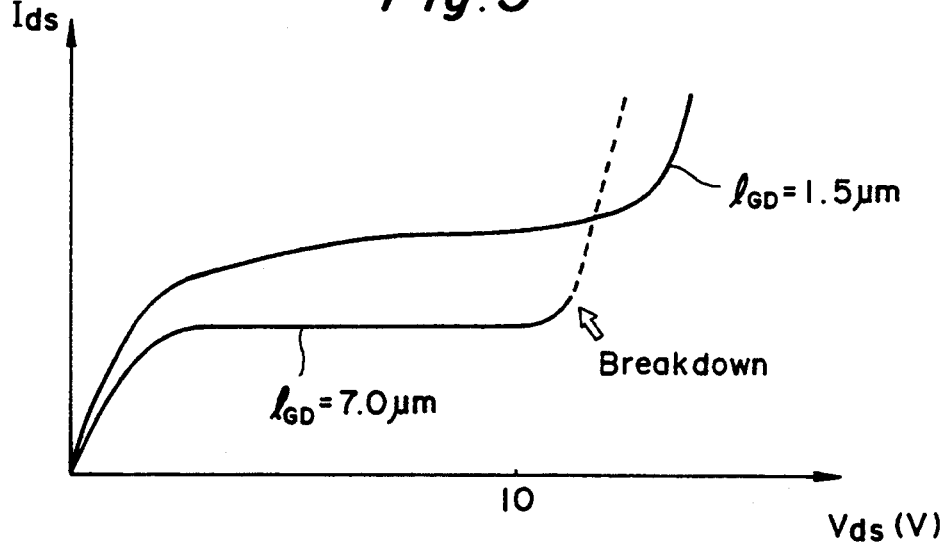
FIG. 3 shows a graph of $I_{ds}$–$V_{ds}$ characteristics of an FET having distance $1_{GD}$ of 1.5 μm and an FET having distance $1_{GD}$ of 7.0 μm.

On the other hand, if the distance $1_{GD}$ is too long, a device area increases and an electric field concentrates towards the drain electrode so that a channel may be broken between the source and the drain. FIG. 3 shows a graph of $I_{ds}$–$V_{ds}$ characteristics for the FET of the present embodiment having the distance $1_{GD}$ of 1.5 μm and an FET having the distance $1_{GD}$ of 7.0 μm. As seen from the graph, when the distance $1_{GD}$ is 7.0 μm, the breakdown occurs when the source-drain voltage $V_{ds}$ exceeds 10 volts. On the other hand, when the distance $1_{GD}$ is 1.5 μm, the breakdown does not occur even if a higher voltage is applied. In practice, it is preferable that the distance $1_{GD}$ is smaller than 5 μm.

In accordance with the FET of the present invention, a high drain breakdown voltage is attained by controlling the distance $1_{GD}$.

Further, since the gate electrode 8 overlaps on the insulation film 5, the real gate length $1_g$ by which the gate electrode 8 contacts to the active layer 2 can be readily shortened, and it is possible to readily manufacture the Mate length of substantially sub-half-micron.

In accordance with the manufacturing method of the present invention, since the n+ region 4 is formed by the ion implantation method using the dummy gate 3 as the mask, it is not necessary to use a refractory material for the gate electrode 8. Accordingly, a gate metal having a low resistance may be used and the increase of the gate resistance is avoided. On the side of the source electrode 8, the n+ region 4 is self-aligned to the gate electrode 8 which is formed at the place of the dummy gate 3. As a result, the resistance between the Schottky contact to the source electrode 8 is reduced and a source parasitic capacitance is reduced.

The FET of the present invention may be effectively utilized as a high power device in a high frequency band.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A field effect transistor comprising:
  an active layer formed in a surface layer of a semiconductor substrate;
  a highly doped impurity source region and a highly doped impurity drain region formed in a surface portion of said semiconductor substrate, said active layer being interposed between said source region and said drain region;
  a gate electrode formed on said semiconductor substrate, said gate electrode having
  a source side edge portion which overlaps said highly doped impurity source region, an insulation film being interposed between said source side edge portion and said highly doped impurity source region, and
  a drain side edge portion which physically contacts said active layer and which does not extend to said highly doped impurity drain region;
  a source electrode formed on said highly doped impurity source region; and
  a drain electrode formed on said highly doped impurity drain region.

2. A field effect transistor according to claim 1 wherein a distance between the gate electrode and the highly doped impurity drain region is between 1 μm and 5 μm, inclusive.

3. A field effect transistor according to claim 2 wherein the insulation film overlaps the active layer.

4. A field effect transistor according to claim 2, wherein said insulation film has an edge portion provided on a source side edge of said active layer.

5. A field effect transistor according to claim 3 wherein the semiconductor substrate is a compound semiconductor substrate.

6. A field effect transistor according to claim 5 wherein the compound semiconductor substrate is a GaAs semiconductor substrate.

* * * * *